United States Patent
Cong et al.

(10) Patent No.: US 10,895,814 B2
(45) Date of Patent: *Jan. 19, 2021

(54) SHIFTING-IN/OUT MECHANISM, AND SHIFTING-IN/OUT DEVICE USED FOR WORKPIECE TABLE OF PHOTOETCHING MACHINE

(71) Applicant: SHANGHAI MICRO ELECTRONICS EQUIPMENT (GROUP) CO., LTD., Shanghai (CN)

(72) Inventors: Guodong Cong, Shanghai (CN); Zhilong Li, Shanghai (CN); Yaqing Huang, Shanghai (CN); Wenbo Zhao, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/618,317

(22) PCT Filed: May 25, 2018

(86) PCT No.: PCT/CN2018/088335
§ 371 (c)(1),
(2) Date: Nov. 29, 2019

(87) PCT Pub. No.: WO2018/219217
PCT Pub. Date: Dec. 6, 2018

(65) Prior Publication Data
US 2020/0117103 A1  Apr. 16, 2020

(30) Foreign Application Priority Data
May 31, 2017 (CN) .......................... 2017 1 0399702

(51) Int. Cl.
*G03B 27/58* (2006.01)
*G03F 7/20* (2006.01)
*H01L 21/677* (2006.01)

(52) U.S. Cl.
CPC .... *G03F 7/70725* (2013.01); *H01L 21/67742* (2013.01); *H01L 21/67748* (2013.01)

(58) Field of Classification Search
CPC ............. G03F 7/70725; G03F 7/70716; G03F 7/70733; G03F 7/70758; G03F 7/70975;
(Continued)

(56) References Cited

U.S. PATENT DOCUMENTS

2020/0012203 A1*  1/2020  Cong .................. G03F 7/70975

FOREIGN PATENT DOCUMENTS

CN  102117758 A   7/2011
CN  102741995 A   10/2012
(Continued)

*Primary Examiner* — Peter B Kim
(74) *Attorney, Agent, or Firm* — Muncy, Geissler, Olds & Lowe, P.C.

(57) ABSTRACT

A shifting-in/out mechanism includes a connecting block, flat spring made of two segments connected by a hinge, spring deflection assembly and wheel assembly. One segment of the flat spring is connected to the wheel assembly and the other is mounted, by the connecting block, on an object to be moved. The spring deflection assembly provides a driving force for deflecting the segment of the flat spring connected to the wheel assembly toward a movement supporting surface. A shifting-in/out device for a workpiece stage of a photoetching machine includes a bottom frame, air spring, air-cushion device and plurality of the mechanisms arranged on a lower or side surfaces of the bottom frame. In the mechanism, the flat spring has two segments hinged
(Continued)

together. All locations of the flat spring that are stressed to cause deflection of the flat spring are substantially on a single line.

17 Claims, 5 Drawing Sheets

(58) Field of Classification Search
CPC ........... H01L 21/0274; H01L 21/67742; H01L 21/67748
See application file for complete search history.

(56) References Cited

FOREIGN PATENT DOCUMENTS

| | | | | |
|---|---|---|---|---|
| CN | 106098605 A | 11/2016 | | |
| CN | 107885037 A | 4/2018 | | |
| KR | 20020089091 A | 11/2002 | | |
| TW | 201035696 A | 10/2010 | | |
| WO | WO-2018059377 A1 * | 4/2018 | ......... | G03F 7/70716 |

* cited by examiner

SHIFTING-IN/OUT MECHANISM, AND SHIFTING-IN/OUT DEVICE USED FOR WORKPIECE TABLE OF PHOTOETCHING MACHINE

TECHNICAL FIELD

The present invention relates to the technical field of photoetching machines and, more specifically, to a shifting-in/out mechanism and a shifting-in/out device for a workpiece stage of a photoetching machine.

BACKGROUND

In a semiconductor manufacturing process, photoetching is an important process for transferring a pattern from a photomask onto a substrate by using a photoresist under the effect of light illumination. The process mainly involves: irradiating ultraviolet light through the photomask onto a surface of the substrate coated with a photoresist film so that a chemical reaction occurs in the exposed regions of the photoresist; dissolving and removing the exposed (in case of a positive photoresist) or unexposed (in case of a negative photoresist) regions by a development process so that the pattern on the photomask is replicated into the photoresist film; and performing an etching process to further transfer the pattern into the substrate.

This process is typically accomplished by a photoetching machine generally comprising an illumination system, a mask stage, a projection imaging system, a workpiece stage (wafer stage) and a bottom frame. In the semiconductor manufacturing process, the photoetching machine controls the energy and shape of the light source to allow a light beam to go through a photomask on which a circuit pattern is defined and to be compensated for various optical errors by the objective lens, in order to scale down the circuit pattern and transfer the scaled-down circuit pattern to the wafer. Subsequently, a circuit pattern can be transferred to the photoresist by a chemical development process.

In the photoetching machine, the workpiece stage is used as a motion platform for supporting and driving an electrostatic sucker on which a wafer is directly loaded. Due to persistent pursuit of semiconductor manufacturers for higher overlay accuracy and productivity, such an electrostatic sucker is required to have higher precision and speed for its synchronous motion. To this end, the electrostatic sucker is typically equipped with air floatation means at the bottom. Marble is used as the material of the motion platform for the sucker. The workpiece stage is also provided with a power driving device, a balancing mass for reducing or offsetting reactive forces, a supporting frame, and some components, such as cables, sensors and pipes, desired for normal operation of all components of the workpiece stage. As a result, the whole workpiece stage has a weight up to several tons. Therefore, it is not recommendable to directly install the entire workpiece stage onto the bottom frame of the photoetching machine.

In addition, during the assembly of the photoetching machine, it is necessary to move the workpiece stage out of and back into the photoetching machine frequently. Further, in order to facilitate troubleshooting or regular maintenance of the workpiece stage, it is also desired to move the workpiece stage frequently and freely.

In conclusion, considering the weight of the workpiece stage, a reasonable structural layout is desirable for the workpiece stage and the bottom frame of the photoetching machine. Moreover, since the workpiece stage needs to be moved out of the photoetching machine for the purpose of maintenance or repair when it has operated for a certain period of time or when it encounters a problem that prohibits its normal operation and to be moved back into the photoetching machine after the completion of the maintenance or repair, it is also desirable to shorten the time required for the maintenance or repair while ensuring the safety of the device during the movement.

SUMMARY OF THE DISCLOSURE

An objective of the present invention is to overcome the problem of jamming caused by excessive torques at non-coplanar hinged junctions arising from the use of conventional shifting-in/out devices based on sliders and cranks and the problem of failure in shifting-in/out movement of a workpiece stage with respect to a photoetching machine due to tip-over of the workpiece stage caused by excessive pressure exerted on the ground surface, through providing a shifting-in/out mechanism and a shifting-in/out device for a workpiece stage of a photoetching machine.

To achieve the above objective, it provides a shifting-in/out mechanism, configured to move an object in or out relative to a movement supporting surface, the shifting-in/out mechanism comprising a connecting block, a flat spring, a spring deflection assembly and a wheel assembly, wherein the flat spring comprises a first segment and a second segment hinged to the first segment, the first segment is mounted on the object by the connecting block, the second segment is connected to the wheel assembly, the spring deflection assembly is configured to provide a driving force for deflecting the second segment toward the movement supporting surface.

Optionally, the first segment and the second segment are hinged together by a flexible hinge.

Further, the spring deflection assembly comprises a slider, a flexible link, a V-shaped link and an adjusting member, the slider is disposed on the flat spring so as to be able to slider thereon, the flexible link has an end hinged to the slider and a further end hinged to an end of the V-shaped link, a further end of the V-shaped link is brought into contact with the object, the V-shaped link has a tip portion hinged to the second segment, the adjusting member is connected to the slider so as to be able to adjust a position of the slider.

Optionally, the flexible link is telescopic.

Optionally, the V-shaped link is provided with a force-applying roller at the end brought into contact with the object and is configured to exert a force on the object through the force-applying roller.

Optionally, the force-applying roller is supported by a holder attached to the object.

Optionally, the adjusting member comprises a screw and a limiting block, the screw threadedly engaging the slider, the limiting block secured to the flat spring, the screw has a head arranged within the limiting block, the screw is configured to be adjusted to change the position of the slider.

Optionally, the wheel assembly comprises a bracket, a wheel, a motor and a transmission gear, the wheel is connected to the flat spring by the bracket, the transmission gear is connected to the wheel at one end and to the motor at another end, the motor is configured to drive the wheel to rotate by the transmission gear.

To achieve the above objective, it also provides a shifting-in/out device, configured for use with a workpiece stage of a photoetching machine, the device comprising a bottom frame on which the workpiece stage is supported, an air spring arranged on a lower surface of the bottom frame, an air-cushion device also disposed on the lower surface of the bottom frame and the shifting-in/out mechanism of any of claims 1 to 8 in contact with the bottom frame.

Optionally, a plurality of the shifting-in/out mechanisms are disposed in pairs and in symmetry on the lower surface or side surfaces of the bottom frame.

In the shifting-in/out mechanism of the present invention, the two segments of the flat spring are connected to each other by a hinge, thus preventing the flat spring to be stuck due to an excessive deflecting torque. Moreover, in the shifting-in/out device of the present invention, a plurality of such shifting-in/out mechanisms may be arranged in pairs and in symmetry on the lower surface or side surfaces of the object so that sufficient friction can be generated between the wheels and the movement supporting surface to drive the workpiece stage to move while avoiding the workpiece stage from tipping over due to an excessive pressure exerted by any of the wheels on the movement supporting surface. Therefore, shifting-in/out movement can be achieved in an automated manner more rapidly with higher safety.

In these figures, 1 denotes an object to be moved; 2 denotes a connecting block; 3 denotes a flat spring; 4 denotes a spring deflection assembly; 401 denotes a hinge; 402 denotes a slider; 403 denotes a flexible link; 404 denotes a V-shaped link; 405 denotes a force-applying roller; 406 denotes a holder; 407 denotes a screw; 408 denotes a limiting block; 5 denotes a wheel assembly; 6 denotes a movement supporting surface; 7 denotes a bottom frame; 8 denotes an air spring; 9 denotes an air-cushion device; 10 denotes an shifting-in/out mechanism; and 11 denotes a bottom frame of a photoetching machine.

DETAILED DESCRIPTION

Specific embodiments of the present invention will be described in greater detail below with reference to the accompanying drawings. Features and advantages of the invention will be more apparent from the following detailed description, and from the appended claims. Note that the drawings are provided in a very simplified form not necessarily drawn to scale, and their only intention is to facilitate convenience and clarity in explaining the embodiments.

As used herein, a "hinge" is meant to refer to a connecting element which connects two objects together while allowing one of them to pivot with respect to the other without being detached therefrom. Accordingly, the term "hinging" is meant to refer to a connection allowing the aforementioned relative movement.

Embodiment 1

Figure 1:
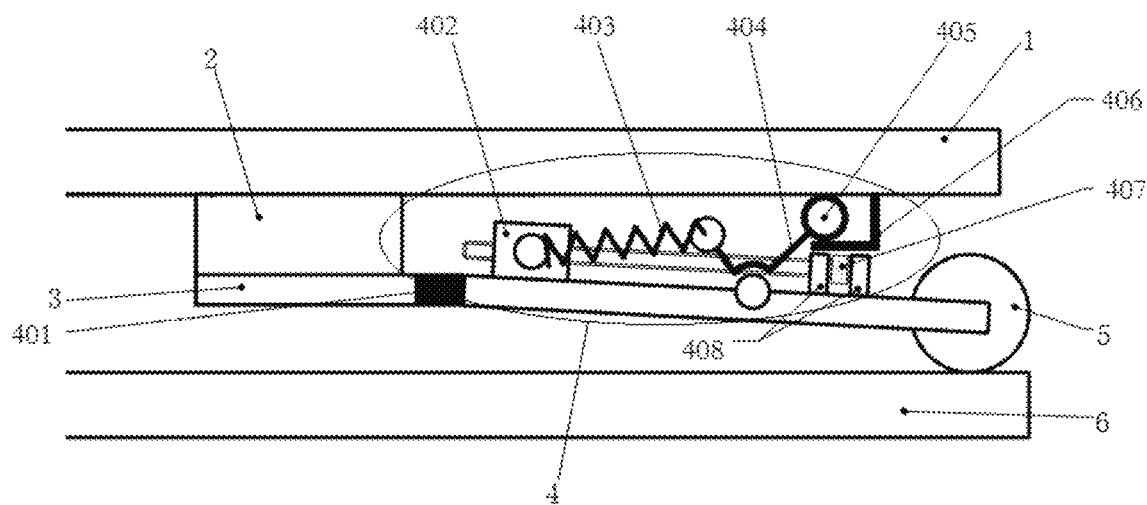
FIG. 1 is a structural schematic diagram of a shifting-in/out mechanism according to a first embodiment of the present invention.

As shown in FIG. 1, the present invention proposes a shifting-in/out mechanism for moving an object 1 in or out relative to a movement supporting surface 6. The shifting-in/out mechanism includes a connecting block 2, a flat spring 3, a spring deflection assembly 4 and a wheel assembly 5. The flat spring 3 is a two-segment structure made up of two segments connected by a hinge 401. One segment of the flat spring 3 (referred to as the "first segment" hereinafter) is mounted on the object 1 by the connecting block 2, while the other segment ("second segment") is connected to the wheel assembly 5. The spring deflection assembly 4 is configured to provide a driving force for deflecting the segment of the flat spring 3 that is connected to the wheel assembly 5 toward the movement supporting surface 6.

The hinge 401 shown in FIG. 1 is merely an example of such a structure that enables relative pivoting between the two segments of the flat spring 3 (i.e., the first and second segments). Of course, as long as the relative pivoting is allowed, the structure may also assume any other suitable hinge form such as a flexible hinge, a bearing or a rotating shaft. In this embodiment, the hinge 401 is preferably a flexible hinge with a linear strip cut away. The flexible hinge operates without clearance or mechanical friction and thus allows the two segments of the flat spring 3 to move relative to each other in a more flexible manner with higher relative displacement accuracy. In addition, the flat spring 3 can deflect more accurately and more stably without being stuck at a particular position.

Further, according to the present invention, the spring deflection assembly 4 may include a slider 402, a flexible link 403, a V-shaped link 404 and an adjusting member. As shown in FIG. 1, the slider 402 is disposed on the flat spring 3 so as to be able to slide thereon, and the flexible link 403 is hinged to the slider 402 at one end and to the V-shaped link 404 at the other end. The other end of the V-shaped link 404 is brought into contact with the object 1. The V-shaped link 404 has a tip portion hinged to the segment of the flat spring 3 connected to the wheel assembly 5. The adjusting member is connected to the slider 402 so as to be able to adjust and change the position of the slider 402.

Optionally, the flexible link 403 may be a telescopic link for providing a tension. Under the action of the slider 402, it may pull the V-shaped link 404 or limit its pivoting.

Optionally, the end of the V-shaped link that is brought into contact with the object 1 may be provided with a force-applying roller 405. The V-shaped link 404 is contacted with the object 1 by the force-applying roller 405. When the V-shaped link 404 pivots, it can apply a force to the object 1 through the force-applying roller 405. In response, a reactive force from the object 1 transmits through the force-applying roller 405 and acts back on the V-shaped link 404, increasing a force that it exerts downward on the segment of the flat spring 3 connected to the wheel assembly 5 and further deflecting this segment downward. As a result, the wheel assembly 5 will come into contact with the movement supporting surface 6 and press against it with sufficient pressure and static friction therebetween.

Optionally, the force-applying roller 405 may be supported by a holder 406 attached to the object 1. The holder 406 may be configured to protect the flat spring 3 from being undesirably pushed down too much and broken.

Optionally, the adjusting member may include a screw 407 and a limiting block 408. The screw 407 threadedly engages the slider 402, and the limiting block 408 is secured to the flat spring 3. The screw 407 may have a head confined within the limiting block 408. The screw 407 can be adjusted to change the position of the slider 402 so that the flexible link 403 is contracted or extended accordingly to cause a pivoting of the V-shaped link 404.

Optionally, the wheel assembly 5 may include a bracket, a wheel, a motor and a transmission gear. The wheel is connected to the flat spring 3 by the bracket, and the transmission gear is connected to the wheel at one end and to the motor at the other end. The motor is configured to drive the wheel to rotate with the aid of the transmission gear.

Further, as shown in FIG. 1, when viewed in the direction of gravity, the force bearing points of the hinge 401, the force-applying roller 405 and the wheel assembly 5 are substantially aligned along a same axis. In other words, these force bearing points are substantially coplanar. This can ensure the balance of forces, thereby avoiding jamming.

Figure 2:
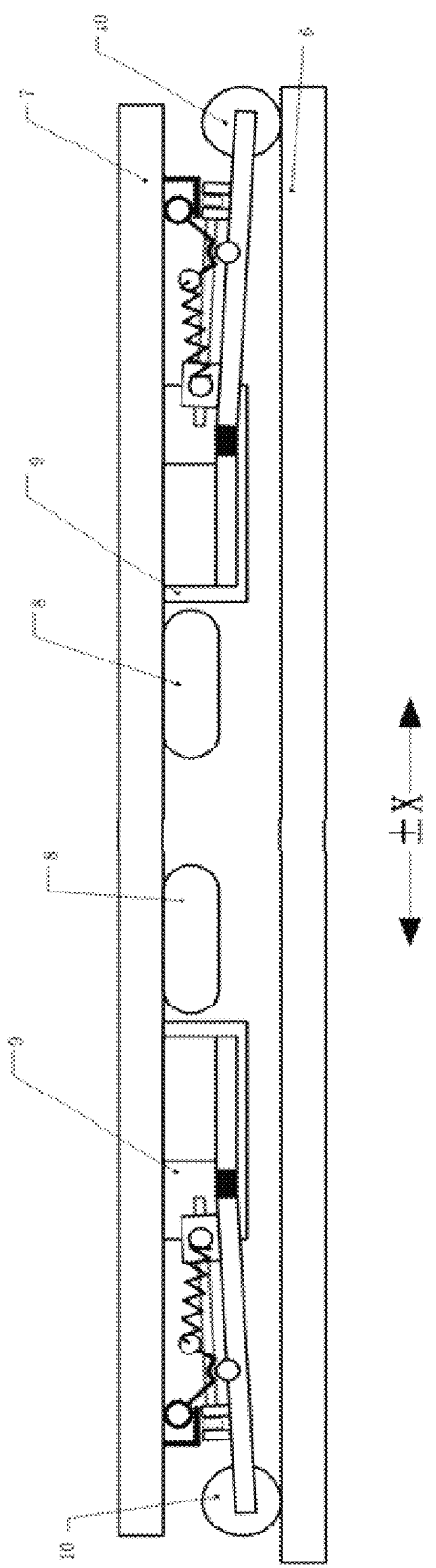
FIG. 2 is a structural schematic diagram of a shifting-in/out device for a workpiece stage of a photoetching machine according to the first embodiment of the present invention.

As shown in FIG. 2, in this embodiment, there is also provided a shifting-in/out device for a workpiece stage of a photoetching machine, comprising a bottom frame 7 on which the workpiece stage is supported, an air spring 8 arranged on a lower surface of the bottom frame, an air-cushion device 9 also disposed on the lower surface of the bottom frame and the shifting-in/out mechanism 10 as defined above. The shifting-in/out mechanism 10 is brought into contact with the bottom frame 7. In this shifting-in/out device, the shifting-in/out mechanism 10 is disposed on the lower surface of the bottom frame 7 which serves as the above-discussed object 1 on which the shifting-in/out mechanism 10 acts. Two such shifting-in/out mechanisms 10 may be disposed in symmetry with a center line of the lower surface of the bottom frame 7 respectively along a move-in and move-out direction X of the workpiece stage, with their wheel assemblies 5 being located at end sides of the workpiece stage. In this way, the pressure applied to the movement supporting surface 6 for the shifting-in/out mechanisms 10, which in this case may be the ground surface, can be effectively dispersed. Thus, the workpiece stage can be steadily supported and moved along the move-in and move-out direction X. In this case, the move-in and move-out direction X is preferred to be a stepping direction along which an exposure procedure is conducted.

Operation of this shifting-in/out device will be described in detail below.

Figure 3:
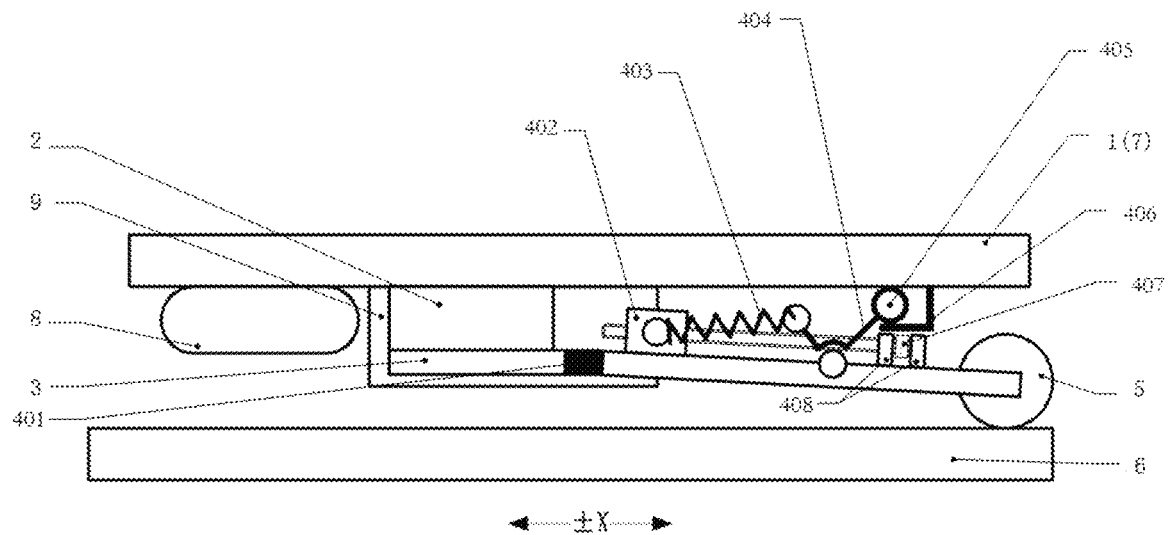
FIG. 3 schematically illustrates the shifting-in/out device in operation when an air-cushion device is floated according to the first embodiment of the present invention.

As shown in FIG. 3, in order to cause the workpiece stage in the photoetching machine to move, for each of the shifting-in/out mechanisms 10, the air spring 8 may be deflated, and the air-cushion device 9 may be activated to create an air cushion between it and the movement supporting surface 6 (ground surface), which supports the bottom frame 7 and hence the workpiece stage thereon. At this point, the adjusting member may be adjusted by turning the screw 407 to cause the slider 402 to pull the flexible link 403 and thus the V-shaped link 404 until an angle between two arms of the V-shaped link 404 is expanded to a certain value so that the V-shaped link 404 starts to pivot counterclockwise about its hinged junction with the flat spring 3. As a result, the force-applying roller 405 applies a force to the bottom frame 7, and a reactive force from the bottom frame 7 against the force-applying roller 405 acts on the hinged junction between the V-shaped link 404 and the flat spring 3. Since the flat spring 3 is a structure with its two segments connected together with the hinge 401, the stressed segment deflects downward, causing the wheel assembly 5 coupled to this segment to come into contact with the movement supporting surface 6 (ground surface). The wheel in the wheel assembly 5 will thus press against the movement supporting surface 6 (ground surface) with sufficient pressure and static friction therebetween. The motor in the wheel assembly 5 can be then activated to drive the wheel to rotate so that the workpiece stage can be moved out from or into the bottom frame 11 along the ±X direction or finely adjusted in position, as shown in FIG. 3, for the purpose of maintenance, repair or alignment.

Figure 4:
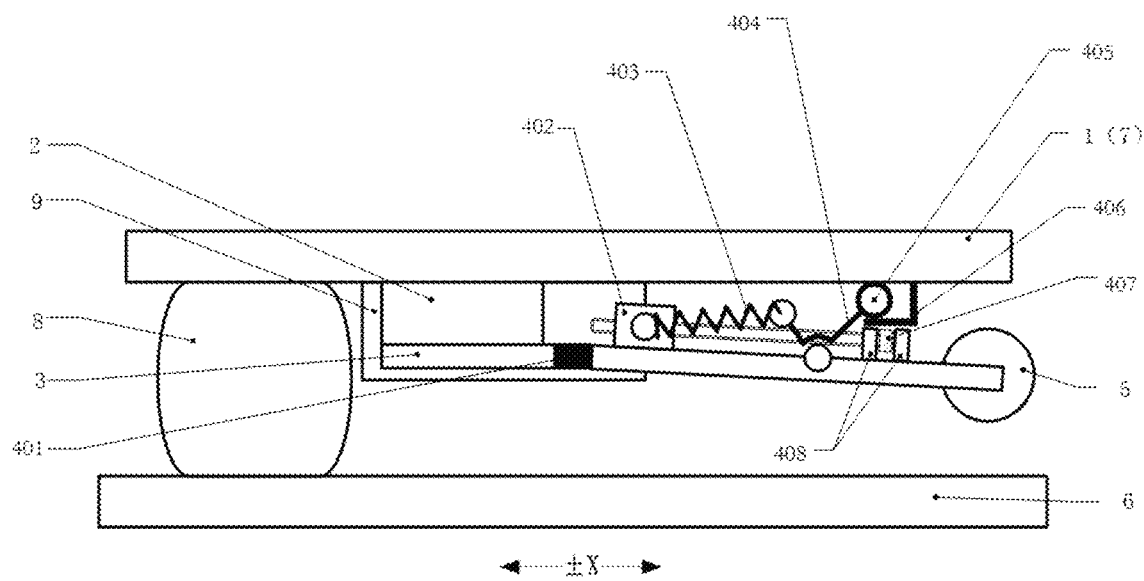
FIG. 4 schematically illustrates the shifting-in/out device in operation when an air spring is expanded according to the first embodiment of the present invention.

As shown in FIG. 4, after the maintenance/repair of the workpiece stage has been completed, the shifting-in/out mechanism 10 may operate to move the workpiece stage into the bottom frame of the photoetching machine. After that, the air-cushion device 9 may be shut down, and the air spring 8 may be inflated and expanded to again support the bottom frame 7 and the workpiece stage thereon. After the workpiece stage has been operatively mounted onto the bottom frame 11 of the photoetching machine, it can be used for photoetching. At this point, both the air-cushion device 9 and the shifting-in/out mechanism 10 may be brought away from contact with the movement supporting surface (ground surface), causing the flexible link 403 to pull the V-shaped link 404 so that the force-applying roller 405 is pressed against the object 1. As a result, the hinged junction between the V-shaped link 404 and the flat spring 3 is subject to a downward force and tends to move in this direction, while the segment of the flat spring 3 connected to the wheel assembly 5 also tends to move downward under the action of gravity, leading to a tightly strained state of the shifting-in/out mechanism 10.

Embodiment 2

Figure 5:
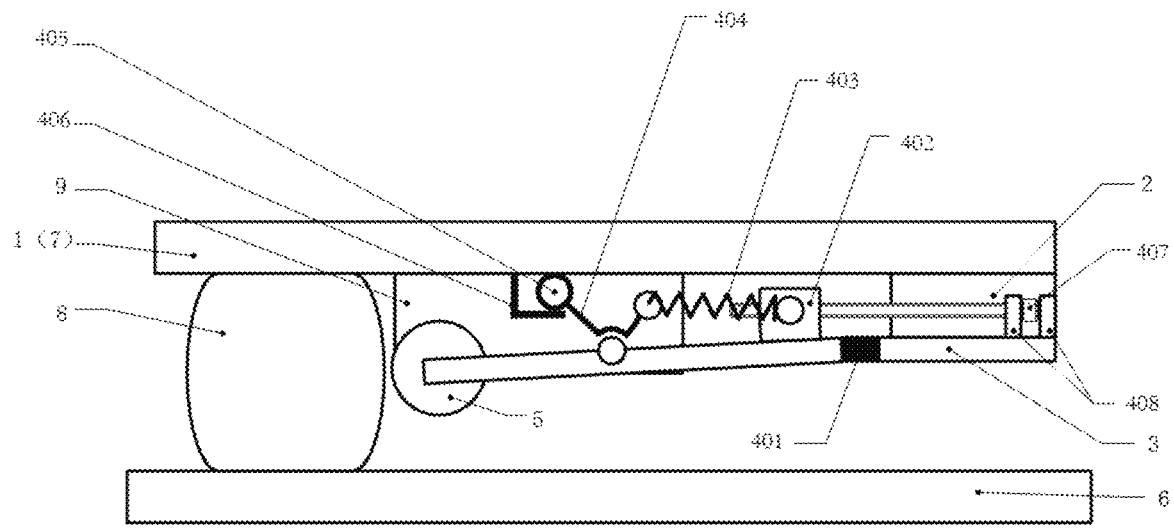
FIG. 5 is a structural schematic diagram of a shifting-in/out mechanism according to a second embodiment of the present invention.

As shown in FIG. 5, according to this embodiment, the shifting-in/out mechanism of Embodiment 1 is horizontally inverted with respect to the object 1 so that the wheel assembly 5 is situated within an area defined by the workpiece stage, while the connecting block 2 and the segment of the flat spring 3 in contact therewith are located at an end side of the workpiece stage. In addition, the adjusting member in the spring deflection assembly 4 is arranged on the segment of the flat spring 3 in contact with the connecting block 2, i.e., located at an end side of the workpiece stage. Reference can be made to the description of Embodiment 1 for other structural details. According to this embodiment, the distance between the adjusting member and the wheel assembly 5 is increased, thereby making adjustment easier.

Embodiment 3

Figure 6:
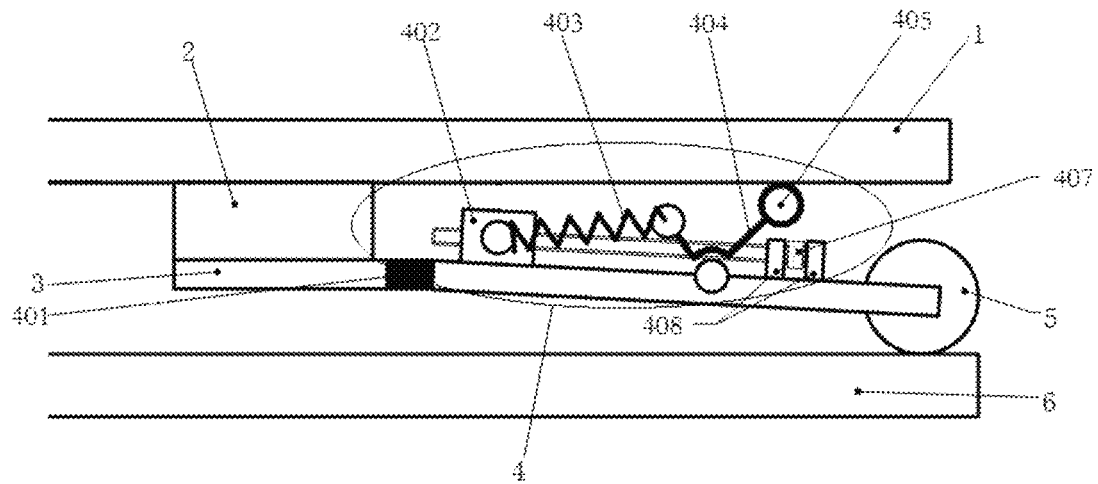
FIG. 6 is a structural schematic diagram of a shifting-in/out mechanism according to a third embodiment of the present invention.

As shown in FIG. 6, considering that it is almost possible for the shifting-in/out mechanism of Embodiment 1 to avoid a misoperation and that, even in a case of misoperation, the hinge 401 can protect the flat spring 3 from being bent downward too much and broken, the holder 406 therefore can be omitted, with the force-applying roller 405 being always kept in contact with the lower surface of the bottom frame 7, in accordance with this embodiment. Reference can be made to the description of Embodiment 1 for other structural details. As such, the shifting-in/out mechanism can be simplified in structure.

Embodiment 4

Figure 7:
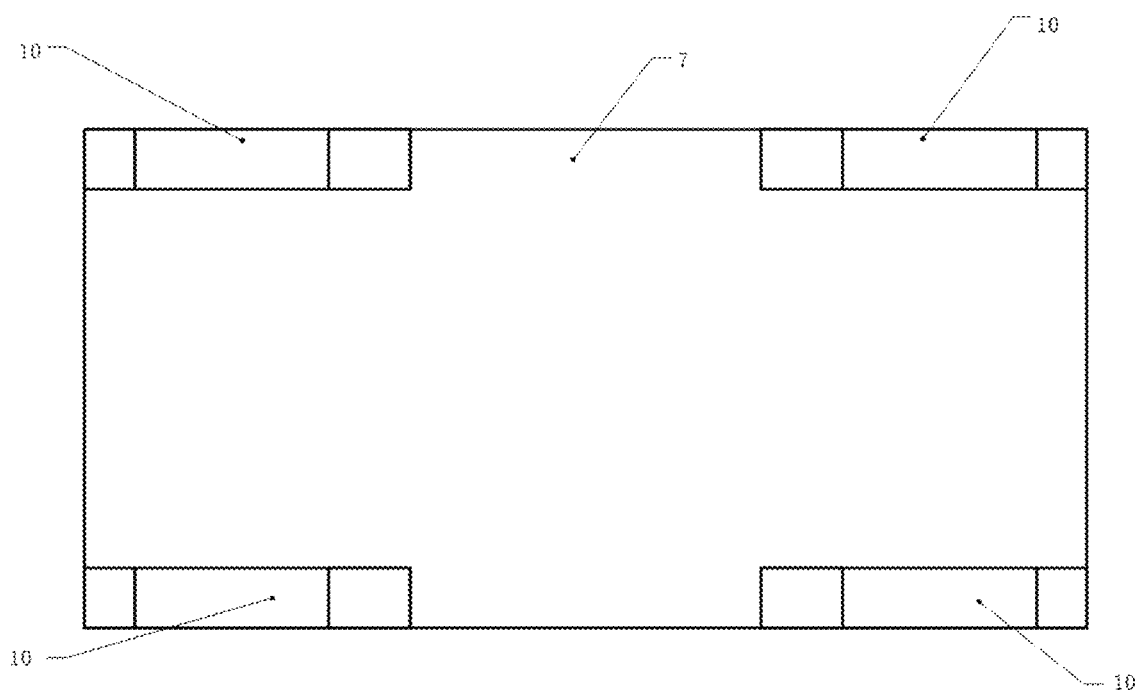
FIG. 7 is a structural schematic diagram of a shifting-in/out device for a workpiece stage of a photoetching machine according to a fourth embodiment of the present invention.

As shown in FIG. 7, in accordance with this embodiment, the shifting-in/out device of Embodiment 1 can be modified as follows: four shifting-in/out mechanisms 10 are arranged at the respective four corners of the lower surface of the bottom frame 7. In this way, the workpiece stage can be moved in/out more steadily with higher safety, and each of the wheels in the mechanisms will apply a reduced force to the movement supporting surface 6 (ground surface), thus better avoiding the workpiece stage from tipping over.

Embodiment 5

Figure 8:
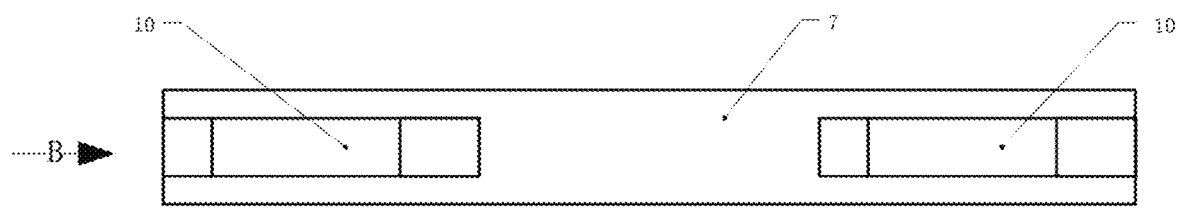
FIG. 8 is a front view of a shifting-in/out device for a workpiece stage of a photoetching machine according to a fifth embodiment of the present invention.
Figure 9:
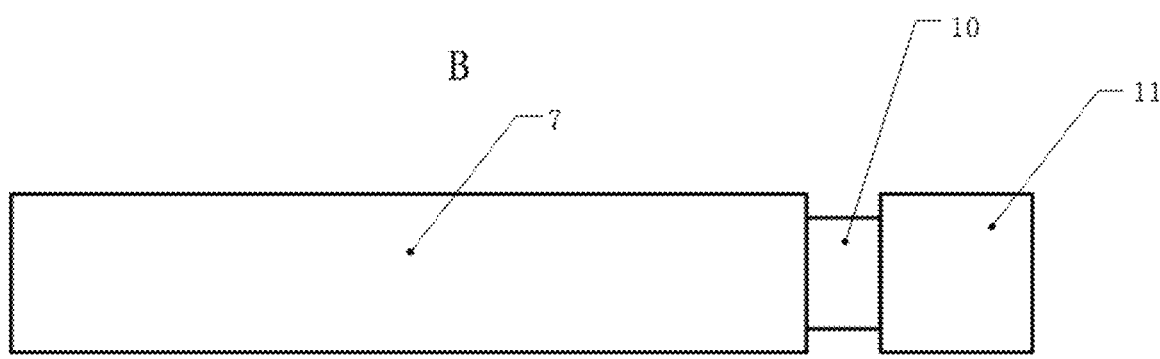
FIG. 9 is a side view of the shifting-in/out device for a workpiece stage of a photoetching machine according to the fifth embodiment of the present invention.

As shown in FIGS. 8 and 9, in accordance with this embodiment, the shifting-in/out device of Embodiment 1 is modified by arranging a number of, preferably two, without limitation, shifting-in/out mechanisms 10 on side surfaces of the bottom frame 7, with the movement supporting surface 6 being provided by the bottom frame 11 of the photoetching machine. This arrangement can completely avoid the workpiece stage from tipping over due to an excessive pressure exerted by any of the wheels on the ground surface.

In summary, in the shifting-in/out mechanism of the present invention, the two segments of the flat spring are connected to each other by a hinge, and all locations of the flat spring that are stressed to cause deflection of the flat spring are substantially on a single line. This ensures that the forces are balanced to prevent the flat spring from being stuck by an excessive deflecting torque. Moreover, in the shifting-in/out device of the present invention, a plurality of such shifting-in/out mechanisms may be arranged in pairs and in symmetry on the lower surface or side surfaces of the object so that sufficient friction can be generated between the wheels and the movement supporting surface to drive the workpiece stage to move while avoiding the workpiece stage from tipping over due to an excessive pressure exerted by any of the wheels on the movement supporting surface, in particular the ground surface. Therefore, shifting-in/out movement can be achieved in an automated manner more rapidly with higher safety.

The embodiments presented above are merely several preferred examples and are in no way meant to limit the present invention. It is intended that any modifications such as equivalent alternatives or variations made to the subject matter or features thereof disclosed herein made by any person of ordinary skill in the art based on the above teachings without departing from the scope of the present invention are also considered to fall within the scope of the present invention.

What is claimed is:

1. A shifting-in/out mechanism, configured to move an object in or out relative to a movement supporting surface, the shifting-in/out mechanism comprising a connecting block, a flat spring, a spring deflection assembly and a wheel assembly, wherein the flat spring comprises a first segment and a second segment hinged to the first segment, the first segment is mounted on the object by the connecting block, the second segment is connected to the wheel assembly, the spring deflection assembly is configured to provide a driving force for deflecting the second segment toward the movement supporting surface.

2. The shifting-in/out mechanism of claim 1, wherein the first segment and the second segment are hinged together by a flexible hinge.

3. The shifting-in/out mechanism of claim 1, wherein the spring deflection assembly comprises a slider, a flexible link, a V-shaped link and an adjusting member, the slider is disposed on the flat spring so as to be able to slide thereon, the flexible link has an end hinged to the slider and a further end hinged to an end of the V-shaped link, a further end of the V-shaped link is brought into contact with the object, the V-shaped link has a tip portion hinged to the second segment, the adjusting member is connected to the slider so as to be able to adjust a position of the slider.

4. The shifting-in/out mechanism of claim 3, wherein the flexible link is telescopic.

5. The shifting-in/out mechanism of claim 3, wherein the V-shaped link is provided with a force-applying roller at the end brought into contact with the object and is configured to exert a force on the object through the force-applying roller.

6. The shifting-in/out mechanism of claim 5, wherein the force-applying roller is supported by a holder attached to the object.

7. The shifting-in/out mechanism of claim 3, wherein the adjusting member comprises a screw and a limiting block, the screw threadedly engaging the slider, the limiting block secured to the flat spring, the screw has a head arranged within the limiting block, the screw is configured to be adjusted to change the position of the slider.

8. The shifting-in/out mechanism of claim 1, wherein the wheel assembly comprises a bracket, a wheel, a motor and a transmission gear, the wheel is connected to the flat spring by the bracket, the transmission gear is connected to the wheel at one end and to the motor at another end, the motor is configured to drive the wheel to rotate by the transmission gear.

9. A shifting-in/out device, configured for use with a workpiece stage of a photoetching machine, the device comprising a bottom frame on which the workpiece stage is supported, an air spring arranged on a lower surface of the bottom frame, an air-cushion device also disposed on the lower surface of the bottom frame and a shifting-in/out mechanism in contact with the bottom frame;

wherein the shifting-in/out mechanism is configured to move an object in or out relative to a movement supporting surface, the shifting-in/out mechanism comprising a connecting block, a flat spring, a spring deflection assembly and a wheel assembly, wherein the flat spring comprises a first segment and a second segment hinged to the first segment, the first segment is mounted on the object by the connecting block, the second segment is connected to the wheel assembly, the spring deflection assembly is configured to provide a driving force for deflecting the second segment toward the movement supporting surface.

10. The shifting-in/out device of claim 9, wherein a plurality of the shifting-in/out mechanisms are disposed in pairs and in symmetry on the lower surface or side surfaces of the bottom frame.

11. The shifting-in/out device of claim 9, wherein the first segment and the second segment are hinged together by a flexible hinge.

12. The shifting-in/out device of claim 9, wherein the spring deflection assembly comprises a slider, a flexible link, a V-shaped link and an adjusting member, the slider is disposed on the flat spring so as to be able to slide thereon, the flexible link has an end hinged to the slider and a further end hinged to an end of the V-shaped link, a further end of the V-shaped link is brought into contact with the object, the V-shaped link has a tip portion hinged to the second segment, the adjusting member is connected to the slider so as to be able to adjust a position of the slider.

13. The shifting-in/out device of claim 12, wherein the flexible link is telescopic.

14. The shifting-in/out device of claim 12, wherein the V-shaped link is provided with a force-applying roller at the end brought into contact with the object and is configured to exert a force on the object through the force-applying roller.

15. The shifting-in/out device of claim 14, wherein the force-applying roller is supported by a holder attached to the object.

16. The shifting-in/out device of claim 12, wherein the adjusting member comprises a screw and a limiting block, the screw threadedly engaging the slider, the limiting block secured to the flat spring, the screw has a head arranged within the limiting block, the screw is configured to be adjusted to change the position of the slider.

17. The shifting-in/out device of claim 9, wherein the wheel assembly comprises a bracket, a wheel, a motor and a transmission gear, the wheel is connected to the flat spring by the bracket, the transmission gear is connected to the wheel at one end and to the motor at another end, the motor is configured to drive the wheel to rotate by the transmission gear.

* * * * *